United States Patent
Jung et al.

(10) Patent No.: US 9,362,451 B2
(45) Date of Patent: *Jun. 7, 2016

(54) LIGHT EMITTING DIODE AND LIGHT EMITTING DEVICE PACKAGE INCLUDING THE SAME

(71) Applicant: LG INNOTEK CO., LTD., Seoul (KR)

(72) Inventors: Myung Hoon Jung, Seoul (KR); Hyun Chul Lim, Seoul (KR); Sul Hee Kim, Seoul (KR); Rak Jun Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,487

(22) Filed: Jan. 12, 2015

(65) Prior Publication Data

US 2015/0155436 A1    Jun. 4, 2015

Related U.S. Application Data

(63) Continuation of application No. 13/325,225, filed on Dec. 14, 2011, now Pat. No. 8,952,400.

(30) Foreign Application Priority Data

Sep. 5, 2011    (KR) .......................... 10-2011-0089492

(51) Int. Cl.
*H01L 33/00* (2010.01)
*H01L 33/20* (2010.01)
(Continued)

(52) U.S. Cl.
CPC . *H01L 33/20* (2013.01); *F21K 9/13* (2013.01); *H01L 33/007* (2013.01); *H01L 33/02* (2013.01);
(Continued)

(58) Field of Classification Search
CPC ......... H01L 33/02; H01L 33/10; H01L 33/44; H01L 33/46; H01L 33/66; H01L 2224/48091; H01L 2924/10158
See application file for complete search history.

(56) References Cited

U.S. PATENT DOCUMENTS 5,877,509 A * 3/1999 Pau ........................ B82Y 10/00
                                                        257/14
7,244,629 B2 * 7/2007 Ezaki et al. ..................... 438/39
(Continued)

FOREIGN PATENT DOCUMENTS

KR        10-1034053 B1      5/2011

OTHER PUBLICATIONS

Cho, Chu-Young, et al.; "Improvement of Light Output Power of InGaN/GaN Light-Emitting Diode by Lateral Epitaxial Overgrowth Using Pyramidal-Shaped $SiO_2$."; Optics Express, vol. 18, No. 2; Jan. 18, 2010; pp. 1462-1468 (XP-002691786).

(Continued)

*Primary Examiner* — Su C Kim
(74) *Attorney, Agent, or Firm* — Ked & Associates, LLP

(57) ABSTRACT

A light emitting diode is disclosed. The disclosed light emitting diode includes a light emitting structure including a first-conductivity-type semiconductor layer, an active layer, and a second-conductivity-type semiconductor layer. The first-conductivity-type semiconductor layer, active layer, and second-conductivity-type semiconductor layer are disposed to be adjacent to one another in a same direction. The active layer includes well and barrier layers alternately stacked at least one time. The well layer has a narrower energy bandgap than the barrier layer. The light emitting diode also includes a mask layer disposed in the first-conductivity-type semiconductor layer, a first electrode disposed on the first-conductivity-type semiconductor layer, and a second electrode disposed on the second-conductivity-type semiconductor layer. The first-conductivity-type semiconductor layer is formed with at least one recess portion.

15 Claims, 14 Drawing Sheets

(51) Int. Cl.
*H01L 33/02* (2010.01)
*H01L 33/24* (2010.01)
*F21K 99/00* (2016.01)
*H01L 33/10* (2010.01)
*H01L 33/22* (2010.01)
*H01L 33/16* (2010.01)
*H01L 33/62* (2010.01)
H01L 33/46 (2010.01)
H01L 21/02 (2006.01)
H01L 33/06 (2010.01)
F21Y 101/02 (2006.01)
H01L 33/44 (2010.01)

(52) U.S. Cl.
CPC .............. *H01L 33/025* (2013.01); *H01L 33/10* (2013.01); *H01L 33/16* (2013.01); *H01L 33/22* (2013.01); *H01L 33/24* (2013.01); *H01L 33/62* (2013.01); *F21Y 2101/02* (2013.01); *H01L 21/0237* (2013.01); *H01L 21/0243* (2013.01); *H01L 21/0254* (2013.01); *H01L 21/02458* (2013.01); *H01L 21/02505* (2013.01); *H01L 21/02521* (2013.01); *H01L 21/02639* (2013.01); *H01L 21/02647* (2013.01); *H01L 33/06* (2013.01); *H01L 33/44* (2013.01); *H01L 33/46* (2013.01); *H01L 2224/48091* (2013.01); *H01L 2924/10158* (2013.01)

(56) References Cited

U.S. PATENT DOCUMENTS

| | | | |
|---|---|---|---|
| 2005/0279994 A1* | 12/2005 | Ueda et al. | 257/33 |
| 2008/0153190 A1* | 6/2008 | Ng et al. | 438/26 |
| 2009/0014713 A1* | 1/2009 | Kang et al. | 257/13 |
| 2009/0166608 A1 | 7/2009 | Nakanishi et al. | 257/13 |
| 2010/0032701 A1* | 2/2010 | Fudeta | 257/98 |
| 2010/0062554 A1 | 3/2010 | Kim | 438/29 |
| 2010/0133562 A1 | 6/2010 | Zhang et al. | 257/94 |

OTHER PUBLICATIONS

European Search Report dated Feb. 25, 2013 issued in Application No. 12 16 0054.

Office Action dated Feb. 8, 2013, issued in U.S. Appl. No. 13/325,225.

Final Office Action dated Jul. 25, 2013, issued in U.S. Appl. No. 13/325,225.

Office Action dated May 23, 2014, issued in U.S. Appl. No. 13/325,225.

Notice of Allowance dated Nov. 4, 2014, issued in U.S. Appl. No. 13/325,225.

* cited by examiner

LIGHT EMITTING DIODE AND LIGHT EMITTING DEVICE PACKAGE INCLUDING THE SAME

CROSS REFERENCE TO RELATED APPLICATION

This application is a Continuation application of prior U.S. patent application Ser. No. 13/325,225 filed Dec. 14, 2011, which claims priority under 35 U.S.C. §119 to Korean Patent Application No 10-2011-0089492, filed in Korea on Sep. 5, 2011, which is hereby incorporated in their entirety by reference as if fully set forth herein.

TECHNICAL FIELD

Embodiments relate to a light emitting diode and a light emitting device package including the same.

BACKGROUND

Light emitting devices, such as light emitting diodes (LEDs) and laser diodes (LDs), which use a Group III-V or Group II-VI compound semiconductor material, may render various colors such as red, green, blue, and ultraviolet by virtue of development of thin film growth technologies and device materials. It may also be possible to produce white light at high efficiency using fluorescent materials or through color mixing. Further, the light emitting devices have advantages, such as low power consumption, semi-permanent lifespan, fast response time, safety, and environmental friendliness as compared to conventional light sources, such as fluorescent lamps and incandescent lamps.

Therefore, these light emitting elements are increasingly applied to transmission modules of optical communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, headlights for vehicles and traffic lights.

Nitride semiconductor light emitting devices employ a sapphire substrate, which is an insulating substrate, because there is no commercially-available substrate having the same crystalline structure as a nitride semiconductor material such as GaN while being lattice matchable with the nitride semiconductor material. In such a nitride semiconductor light emitting device, there may be lattice constant and thermal expansion coefficient differences between the sapphire substrate and a GaN layer grown over the sapphire substrate. As a result, lattice mismatch may occur between the sapphire substrate and the GaN layer, so that numerous crystal defects may be present in the GaN layer.

Such crystal defects may cause an increase in leakage current. When external static electricity is applied to the light emitting device, the active layer of the light emitting device, which has numerous crystal defects, may be damaged by an intense field generated due to the static electricity. Generally, it is known that there are crystal defects (threading defects) in a GaN thin film at a density of $10^{10}$ to $10^{12}/cm^2$.

Such a nitride semiconductor light emitting device, which has numerous crystal defects, may be very weak against electrical impact. To this end, technologies and standardization for protection of nitride semiconductor light emitting devices from static electricity and lightning are being highlighted as very important technical issues.

Generally, a conventional GaN light emitting device has electrostatic discharge (ESD) characteristics that the device can withstand, in a human body mode (HBM), static electricity of up to several thousand volts in a forward direction, but cannot withstand static electricity of several hundred volts in a reverse direction. Such ESD characteristics are exhibited mainly due to the crystal detects of the device, as mentioned above.

In order to improve such ESD characteristics, and thus to protect the light emitting device from ESD, a proposal to connect a Schottky diode or a Zener diode with the light emitting device in parallel has been made. However, such a proposal causes troublesomeness and an increase in manufacturing costs in that a Schottky diode or a Zener diode is separately required.

Therefore, it is necessary to improve the structure of the light emitting device, and thus to improve the ESD characteristics of the light emitting device.

SUMMARY

Embodiments achieve an improvement in the electrostatic discharge (ESD) characteristics of a light emitting device, and thus achieve an enhancement in reliability.

In one embodiment, a light emitting device includes a light emitting structure including a first-conductivity-type semiconductor layer, an active layer, and a second-conductivity-type semiconductor layer, wherein the first-conductivity-type semiconductor layer, the active layer, and the second-conductivity-type semiconductor layer are disposed to be adjacent to one another in a same direction, the active layer includes well and barrier layers alternately stacked at least one time, and the well layer has a narrower energy bandgap than the barrier layer, a mask layer disposed in the first-conductivity-type semiconductor layer, a first electrode disposed on the first-conductivity-type semiconductor layer, and a second electrode disposed on the second-conductivity-type semiconductor layer, wherein the first-conductivity-type semiconductor layer is formed with at least one recess portion.

In another embodiment, a light emitting device includes a light emitting structure including a first-conductivity-type semiconductor layer, an active layer, and a second-conductivity-type semiconductor layer, a mask layer disposed in the first-conductivity-type semiconductor layer, the mask layer including a window region, a first electrode disposed on the first-conductivity-type semiconductor layer, and a second electrode disposed on the second-conductivity-type semiconductor layer, wherein the first-conductivity-type semiconductor layer includes at least one recess portion formed to vertically overlap the window region of the mask layer.

In another embodiment, a light emitting device package includes a package body, first and second lead frames disposed on the package body, and a light emitting device disposed on the package body, and electrically connected to the first and second lead frames, wherein the light emitting device includes a substrate, a light emitting structure disposed on the substrate, the light emitting structure including a first-conductivity-type semiconductor layer, an active layer, and a second-conductivity-type semiconductor layer, wherein the first-conductivity-type semiconductor layer, the active layer, and the second-conductivity-type semiconductor layer are disposed to be adjacent to one another in a same direction, the active layer includes well and barrier layers alternately stacked at least one time, and the well layer has a narrower energy bandgap than the barrier layer, a mask layer disposed in the first-conductivity-type semiconductor layer, a first electrode disposed on the first-conductivity-type semiconductor layer, and a second electrode disposed on the second-conductivity-type semiconductor layer, and wherein the first-conductivity-type semiconductor layer is formed with at least one recess portion.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
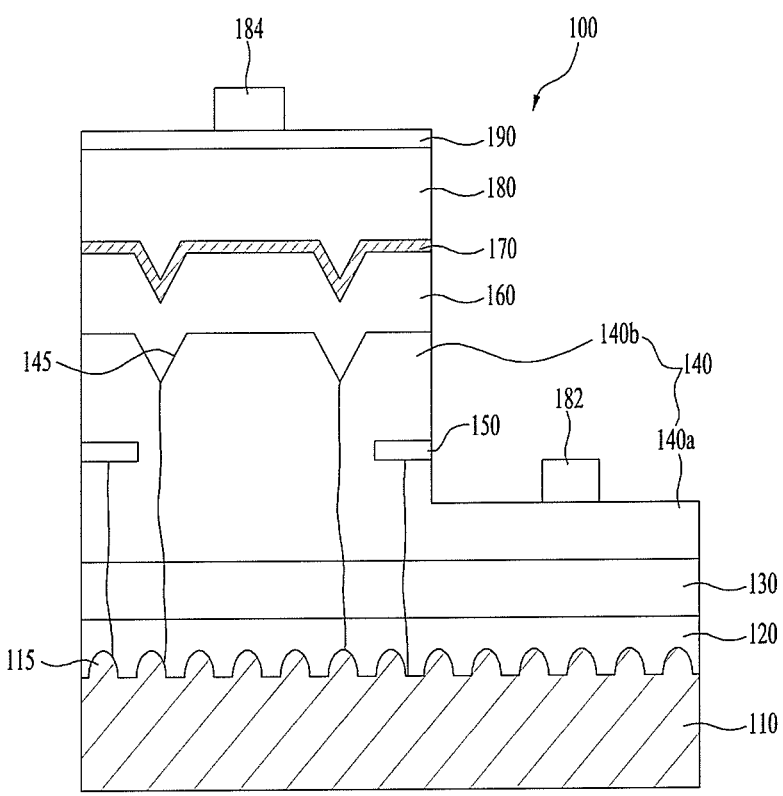
FIG. 1 is a sectional view illustrating a light emitting device according to an exemplary embodiment.

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thickness or size of each layer is exaggerated, omitted, or schematically illustrated for convenience of description and clarity. Also, the size or area of each constituent element does not entirely reflect the actual size thereof.

FIG. 1 is a sectional view illustrating a light emitting device according to an exemplary embodiment. FIG. 1 illustrates a horizontal light emitting device.

In these embodiments or other embodiments, the light emitting device may be semiconductor light emitting device, for example, light emitting diode.

Referring to FIG. 1, a light emitting device 100 is shown. The light emitting device 100 includes a buffer layer 120 disposed over a substrate 110, an undoped semiconductor layer 130 disposed over the buffer layer 120, and a light emitting structure disposed on the undoped semiconductor layer 130. The light emitting structure includes a first-conductivity-type semiconductor layer 140, an active layer 160, and a second-conductivity-type semiconductor layer 180, which are sequentially disposed on the undoped semiconductor layer 130 in this order.

The buffer 120 is adapted to reduce lattice mismatch and thermal expansion coefficient differences between the substrate 110 and the semiconductor layer grown over the substrate 110. Of course, the buffer 120 is not a necessity.

The first-conductivity-type semiconductor layer 140, active layer 160, and second-conductivity-type semiconductor layer 180 are stacked in the same direction while being arranged to be adjacent to one another. The first-conductivity-type semiconductor layer 140, active layer 160, and second-conductivity-type semiconductor layer 180 may have different thicknesses.

A mask layer 150 may be disposed in the first-conductivity-type semiconductor layer 140. A recess portion 145 may also be formed on the first-conductivity-type semiconductor layer 140. recess portion recess portion The mask layer 150 may have a single layer structure or a multilayer structure.

The mask layer 150 has a masking region covered by a mask, and a window region not covered by the mask. This will be described hereinafter. The recess portion 150 may be formed on a portion of the first-conductivity-type semiconductor layer 140, namely, a first-conductivity-type semiconductor layer 140b, to correspond to the window region of the mask layer 150.

The mask layer 150 may be disposed between the window region and the active layer 160.

The recess portion 145 may have a V-pit shape, an inverted polygonal corn shape, or an inverted pyramid shape.

The light emitting device may also include an electron blocking layer 170 disposed between the active layer 160 and the second-conductivity-type semiconductor layer 180.

The light emitting structure may be mesa-etched from the second-conductivity-type semiconductor layer 180 to a portion of the first-conductivity-type semiconductor layer 140. A first electrode 182 may be disposed on a portion of the first-conductivity-type semiconductor layer 140 exposed in accordance with the mesa-etching, namely, a first-conductivity-type semiconductor layer 140a.

A second electrode 184 may be disposed on the second-conductivity-type semiconductor layer 180.

A current spreading layer 190 may be formed between the second-conductivity-type semiconductor layer 180 and the second layer 184.

The current spreading layer 190 may be arranged such that at least a portion thereof contacts the second electrode 184.

The current spreading layer 190 is electrically connected with the second electrode 184, to uniformly diffuse current supplied from the second electrode 184, and thus to achieve an enhancement in the light emission efficiency of the light emitting device 100.

The current spreading layer 190 may be made of a metal having high electrical conductivity. For example, the current spreading layer 190 may selectively include at least one selected from the group consisting of Ti, Au, Ni, In, Co, W, and Fe, although the embodiment is not limited thereto.

The current spreading layer 190 may be formed at a portion or entirety of the upper surface of the second-conductivity-type semiconductor layer 180, although the embodiment is not limited thereto. For example, the current spreading layer 190 may be formed such that at least a portion thereof vertically overlaps the second electrode 184.

FIGS. 2 to 9 are views illustrating a method for manufacturing the light emitting device in accordance with an exemplary embodiment. Hereinafter, the light emitting device manufacturing method according to the illustrated embodiment will be described with reference to FIGS. 2 to 9.

Figure 2:
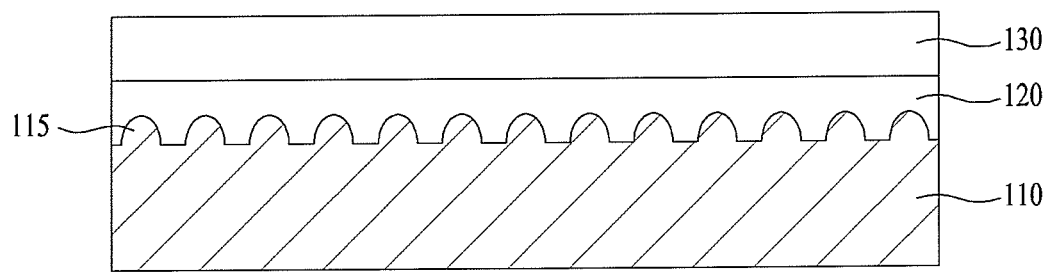
FIGS. 2 to 9 are views illustrating a method for manufacturing the light emitting device in accordance with an exemplary embodiment.

Referring to FIG. 2, first, the buffer layer 120 and undoped semiconductor layer 130 are grown over the substrate 110.

The substrate 110 may be formed using a material suitable for growth of a semiconductor material or a carrier wafer. The substrate 110 may also be made of a material having excellent thermal conductivity. The substrate 110 may be a conductive substrate or an insulating substrate. For example, the substrate 110 may be made of at least one of sapphire ($Al_2O_3$), SiC, GaAs, GaN, ZnO, Si, GaP, InP, Ge, or $Ga_2O_3$. Wet washing may be performed upon the substrate 110, to remove impurities from the surface of the substrate 110.

A light extraction structure 115 such as a roughness may be formed over a surface of the substrate 110, to which the light emitting structure will be adjacent.

The light extraction structure 115 may have periodic patterns or non-periodic patterns.

Light generated from the light emitting structure is outwardly emitted from the light emitting device after being irregularly reflected by the light extraction structure 115. Thus, the light extraction efficiency of the light emitting device 100 is enhanced.

The buffer layer 120, which is stacked over the substrate 110, is adapted to reduce lattice mismatch and thermal expansion coefficient differences between the material of the substrate 110 and the material of the layer formed over the substrate 110. The buffer layer 120 may be made of a Group III-V compound semiconductor, for example, at least one of GaN, InN, AlN, InGaN, AlGaN, InAlGaN, or AlInN.

The undoped semiconductor layer 130 is formed to achieve an enhancement in the crystallinity of the first-conductivity-type semiconductor layer 140, which will be subsequently grown. The undoped semiconductor layer 130 may be identical to the first-conductivity-type semiconductor layer 140, except that it has considerably low electrical conductivity, as compared to the first-conductivity-type semiconductor layer 140, because the undoped semiconductor layer 130 is not doped with an n-type dopant.

Alternatively, the undoped semiconductor layer 130 may not be grown.

Figure 3:
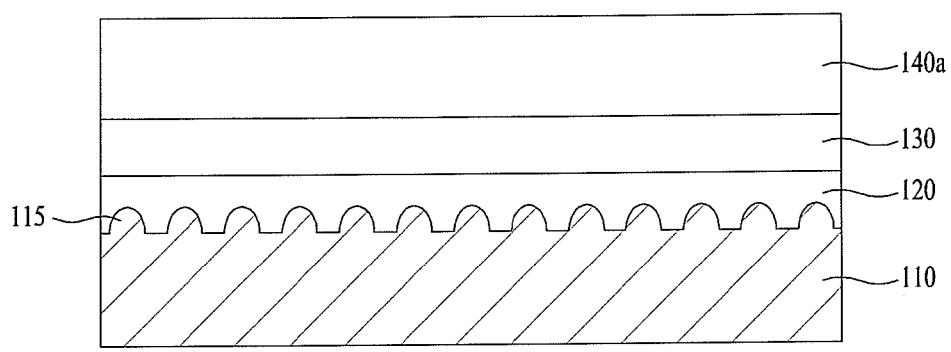

Referring to FIG. 3, the first-conductivity-type semiconductor layer 140a is then grown over the undoped semiconductor layer 130.

The first-conductivity-type semiconductor layer 140a may be made of a semiconductor compound, for example, a Group III-V or Group II-VI compound semiconductor. The first-conductivity-type semiconductor layer 140a may be doped with a first-conductivity-type dopant. When the first-conductivity-type semiconductor layer 140a is an n-type semiconductor layer, the first-conductivity-type dopant is an n-type dopant. The n-type dopant may include Si, Ge, Sn, Se, or Te, although the embodiment is not limited thereto. When the first-conductivity-type semiconductor layer 140a is a p-type semiconductor layer, the first-conductivity-type dopant is a p-type dopant. The p-type dopant may include Mg, Zn, Ca, Sr, Ba, or the like, although the embodiment is not limited thereto.

The first-conductivity-type semiconductor layer 140a may include a semiconductor material having a formula of $Al_xIn_yGa_{1-x-y}N$ ($0 \le x \le 1$, $0 \le y \le 1$, and $0 \le x+y \le 1$). For example, the first-conductivity-type semiconductor layer 140a may be made of at least one of GaN, InN, AlN, InGaN, AlGaN, InAlGaN, AlInN, AlGaAs, InGaAs, AlInGaAs, GaP, AlGaP, InGaP, or AlInGaP.

Referring to FIG. 4, the mask layer 150 is then formed over the first-conductivity-type semiconductor layer 140a.

Figure 4A:
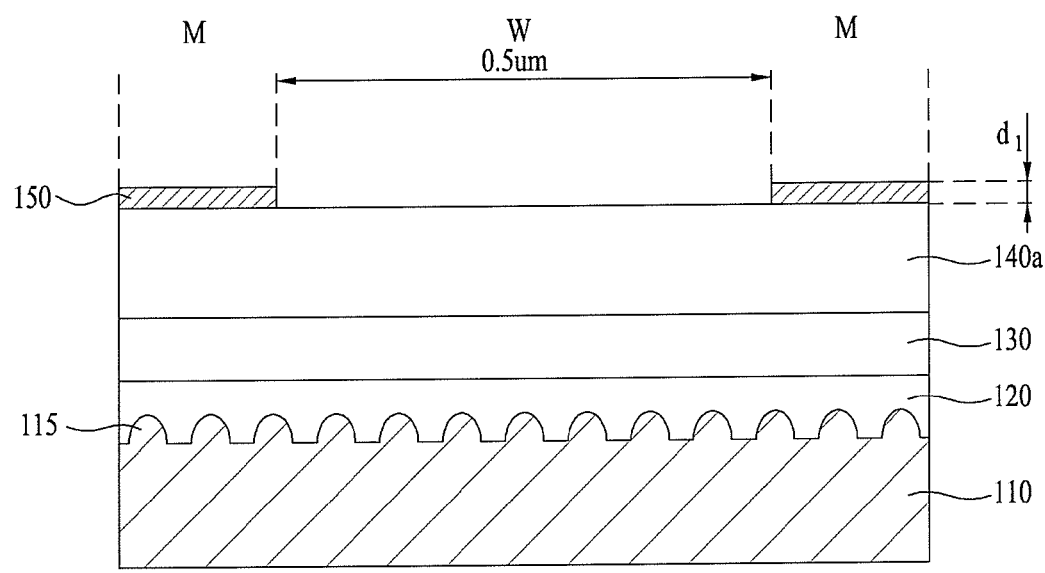

FIG. 4A is a sectional view illustrating a structure obtained after formation of the mask layer 150. FIGS. 4B to 4G are plan views of the structure obtained after formation of the mask layer 150.

In an exemplary embodiment, the first-conductivity-type semiconductor layers 140a and 140b are grown in accordance with an epitaxial lateral overgrowth (ELO) process.

Crystal defects such as threading dislocations advancing from an interface between the substrate 110 and a nitride (GaN) semiconductor layer grown over the substrate 110 to an upper surface of the light emitting device may be formed due to a lattice constant difference between the substrate 110 and the nitride semiconductor layer. The ELO process is a process for reducing crystal defects as described above.

The ELO process is a method for suppressing migration of crystal defects formed at the substrate and the nitride semiconductor layer toward a top of the light emitting device by growing a nitride semiconductor layer in a lateral direction.

The mask layer 150 has a masking region M covered by a mask, and a window region W not covered by a mask. Although the mask layer 150 can have several window regions W in the illustrated case, the following description will be given only in conjunction with one window region W, for simplicity of description.

The mask layer may include a silicon oxide film ($SiO_2$) or a silicon nitride film (SiN).

The mask layer 150 may have a thickness dl of 0.01 to 1.5 μm. When the mask layer 150 is excessively thin, it may not perform a mask function required in the ELO process. On the other hand, when the mask layer 150 is excessively thick, the resultant light emitting device may be unnecessarily thickened. In the latter case, the mask layer 150 may interfere with lateral growth of the first-conductivity-type semiconductor layer.

The width ratio between the window region W and the masking region M may be 1:0.1 to 10. In this case, the width of the window region W may be at least 0.5 μm.

Referring to FIG. 4A, the width of the window region W means a horizontal width of the light emitting device not covered by the mask, whereas the width of the masking region M means a horizontal width of the light emitting device covered by the mask. As described above with reference to FIG. 1, the width of the window region W has a relation with formation of the recess portion 145 because the recess portion 145 is formed at a portion of the first-conductivity-type semiconductor layer 140b corresponding to the window region W Accordingly, when the widow region W has a width $d_w$ less than 0.5 μm, it may interfere with formation of the recess portion 145. In this case, the effects of enhancing the ESD characteristics of the light emitting device may be greatly reduced.

The mask layer 150 may be patterned such that the masking region M and window region W have certain horizontal section shapes when viewed from the top side.

The mask layer 150 suppresses migration of crystal defects formed at an interface between the substrate and the nitride semiconductor layer toward the top of the light emitting device. Accordingly, it may be possible to control formation of a threading dislocation such that the threading dislocation is formed at a desired position when viewed from the top side of the light emitting device.

For example, the horizontal section shape of the mask layer 150 may be a lattice shape, a stripe shape, a circular shape, an oval shape, or a polygonal shape when viewed from the top side.

The patterning of the mask layer 150 may be achieved such that the masking region M covered by the mask has a lattice shape, a stripe shape, a circular shape, an oval shape, or a polygonal shape. Alternatively, the patterning of the mask layer 150 may be achieved such that the window region W not covered by the mask has a lattice shape, a stripe shape, a circular shape, an oval shape, or a polygonal shape. Of course, the embodiment is not limited to the above-described conditions.

Figure 4B:
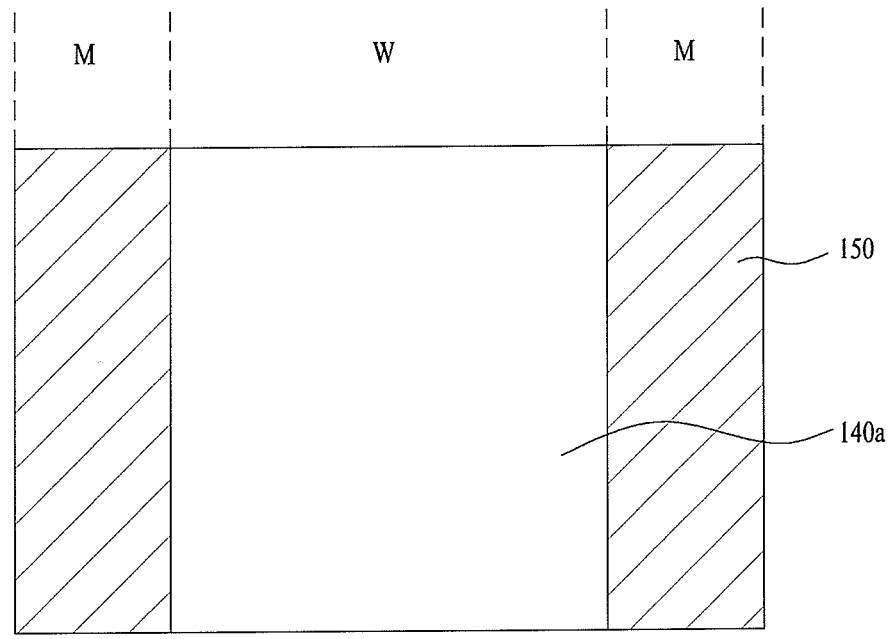

Referring to FIG. 4B, it can be seen that the mask layer 150 in the light emitting device of FIG. 4A is patterned to have a stripe shape.

Figure 4C:
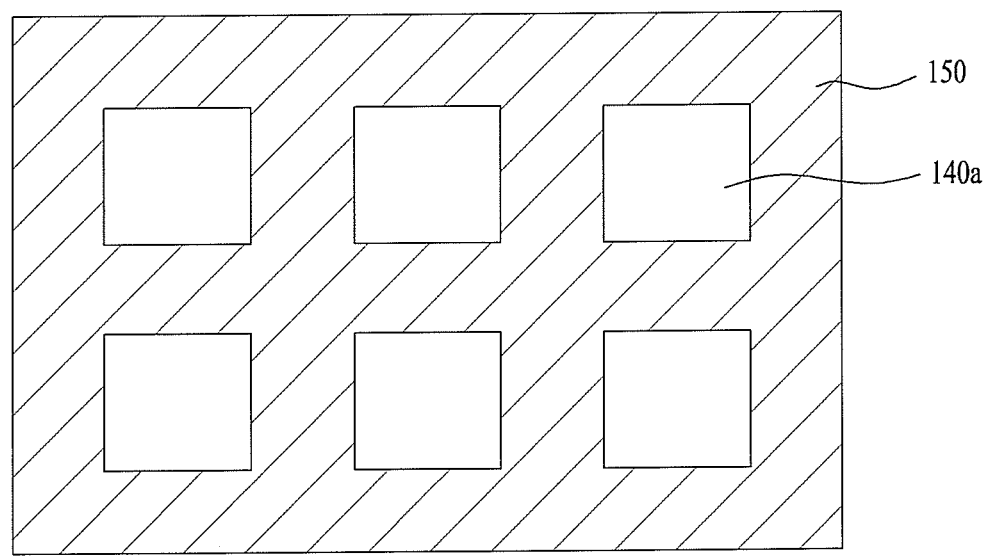
Figure 4D:
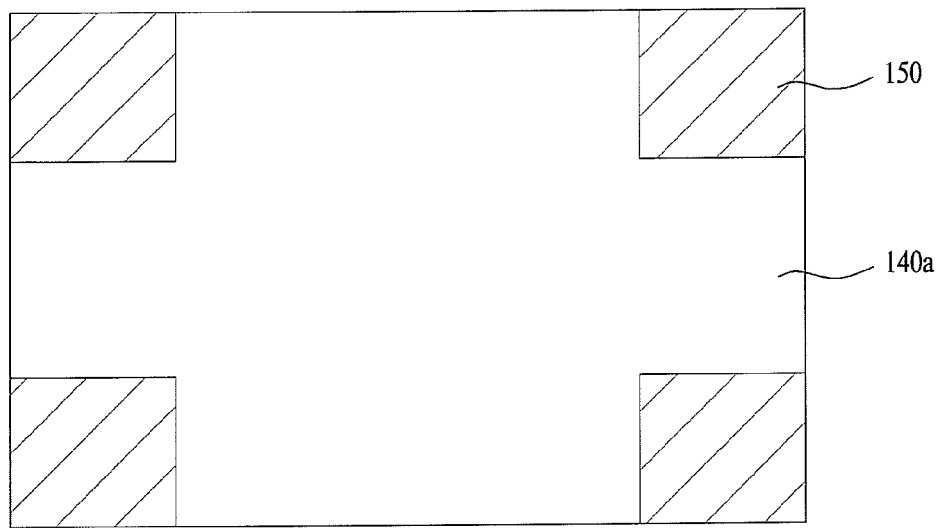
Figure 4E:
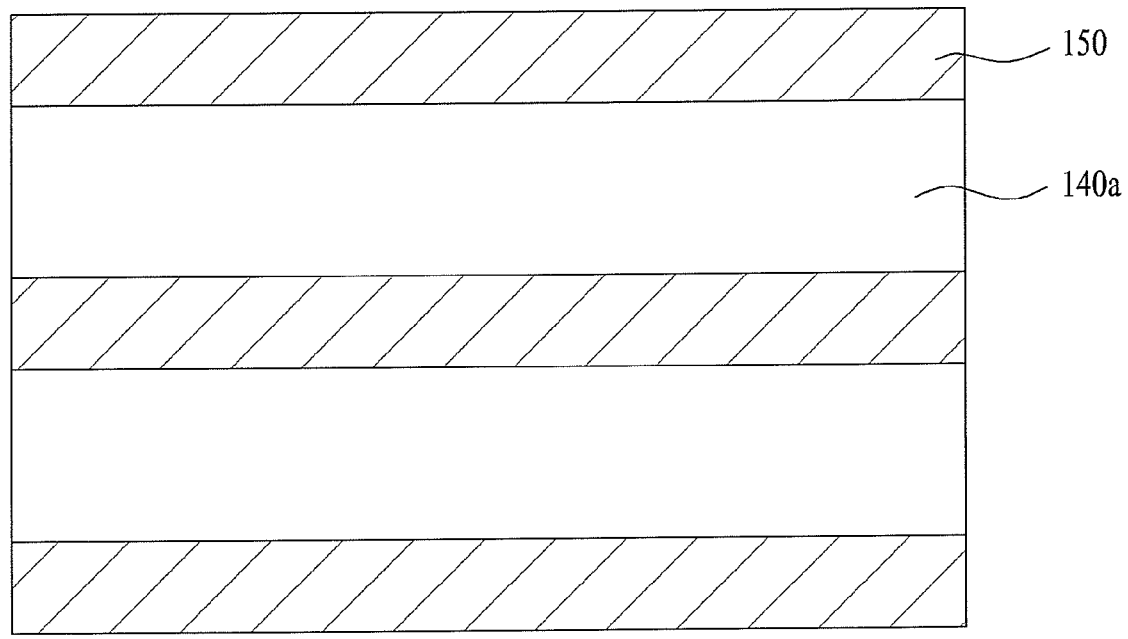
Figure 4F:
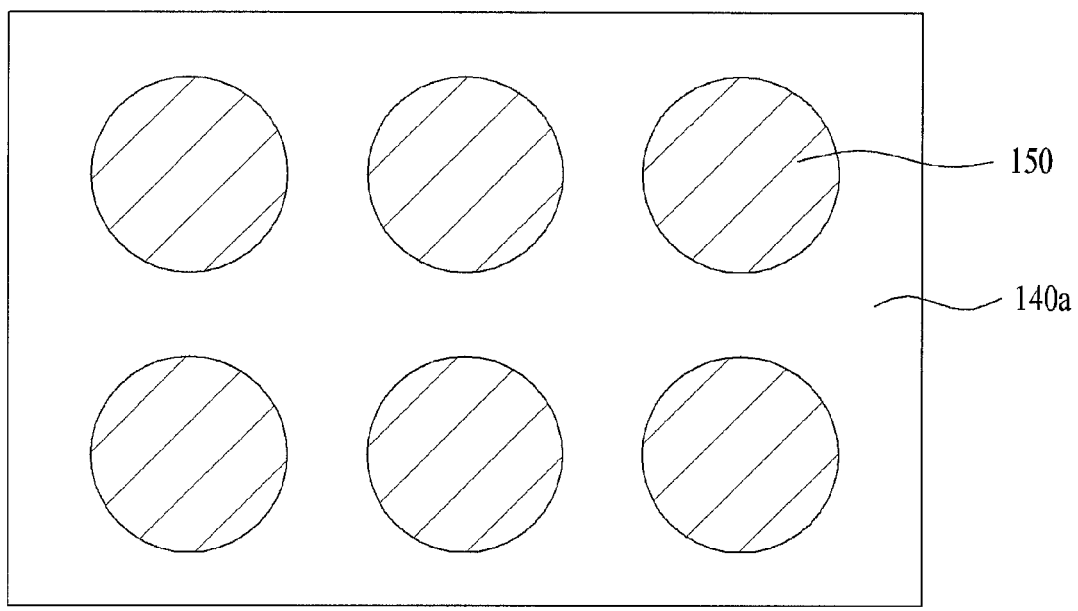
Figure 4G:
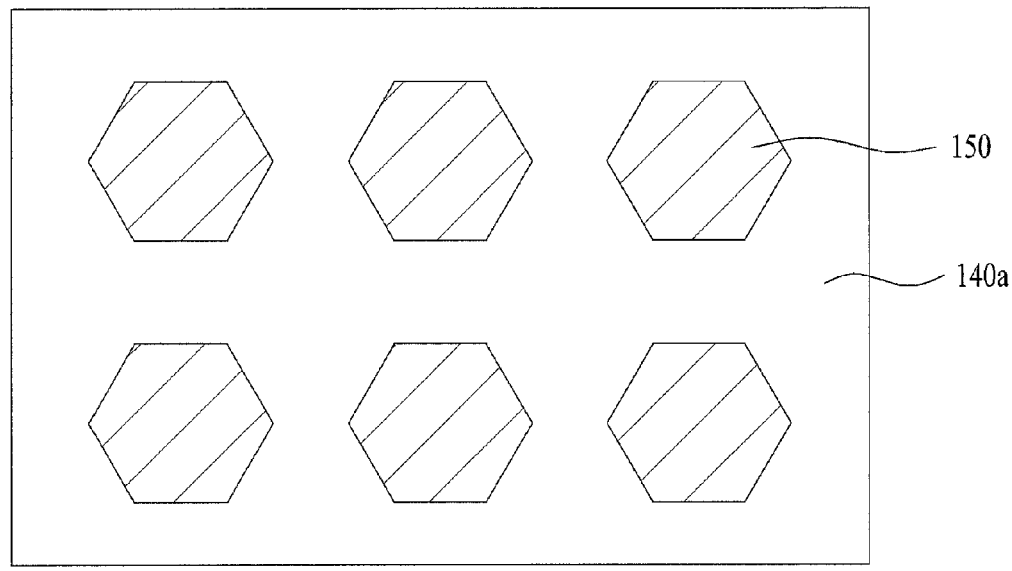

Also, for example, the mask layer 150 may be patterned such that the masking region M has a lattice shape, and the window region W has a polygonal shape, as shown in FIG. 4C. On the other hand, as shown in FIG. 4D, the mask layer 150 may be patterned such that the masking region M has a polygonal shape. Also, as shown in FIG. 4E, the mask layer 150 may be patterned such that the masking region M has another stripe shape. As shown in FIG. 4F, the mask layer 150 may be patterned such that the masking region M has a circular shape. Also, as shown in FIG. 4G, the mask layer 150 may be patterned such that the masking region M has another polygonal shape.

Figure 5:
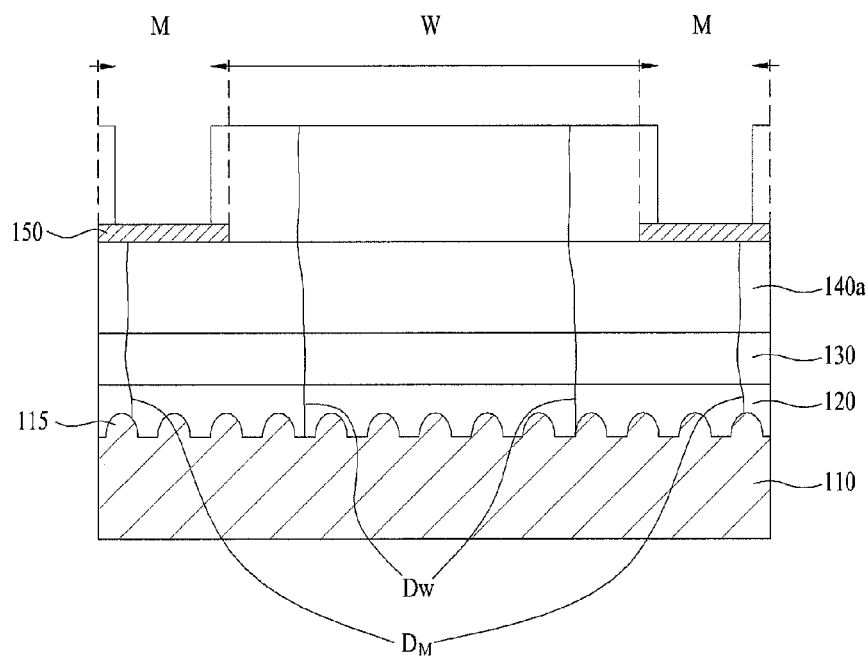

Referring to FIG. 5, the first-conductivity-type semiconductor layer 140b is re-grown over the window region W where no mask is formed.

The first-conductivity-type semiconductor layer 140b has the same composition as the material of the first-conductivity-type semiconductor layer 140a.

As the first-conductivity-type semiconductor layer 140b re-grown over the window region W is laterally grown in directions indicated by opposite arrows of FIG. 5 such that growing portions thereof are joined, the first-conductivity-type semiconductor layer 140b has an integrated structure.

Referring to FIG. 5, it can be seen that a threading dislocation $D_W$, which is formed at an upper interface of the substrate 110, reaches a portion of the first-conductivity-type semiconductor layer 140b re-grown in the region exposed through the window region W, whereas a threading dislocation $D_M$, which is formed at the upper interface of the substrate 110, cannot reach a portion of the first-conductivity-type semiconductor layer 140b laterally grown in a region covered by the masking region M.

Accordingly, it may be possible to control the position of the threading dislocation D reaching the top of the light emitting device in accordance with the pattern shape of the mask layer 150.

Figure 6:
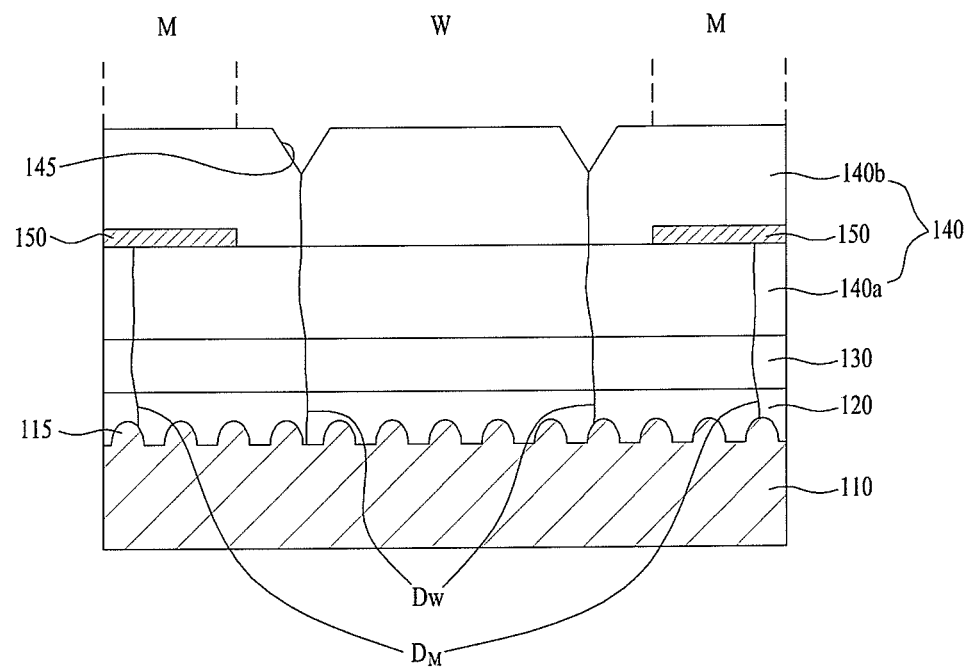

Referring to FIG. 6, the recess portion 145 is formed at a portion of the first-conductivity-type semiconductor layer 140b where a threading dislocation $D_W$ reaches after passing through the window region W of the mask layer 150.

That is, as shown in FIG. 6, the recess portion 145 may be disposed over the window region W of the mask layer 150.

The recess portion 145 may be naturally formed during the growth of the first-conductivity-type semiconductor layer 140b. That is, the recess portion 145 may be formed simultaneously with the growth of the first-conductivity-type semiconductor layer 140b.

For example, the recess portion 145 may be formed through control of the crystal growth rate of the first-conductivity-type semiconductor layer 140b. The crystal growth rate may be controlled in accordance with, for example, the precursor flow rate, growth pressure, growth temperature, doping level, or the like of the first-conductivity-type semiconductor layer 140b.

The recess portion 145 is formed around the threading dislocation $D_W$ threading through the light emitting structure. Accordingly, it may be possible to avoid a phenomenon in which current is concentrated on the threading dislocation $D_W$. That is, the rate of carriers contributing to emission of light is increased, thereby suppressing generation of leakage current. Thus, the light emission efficiency of the light emitting device may be enhanced.

Figure 7:
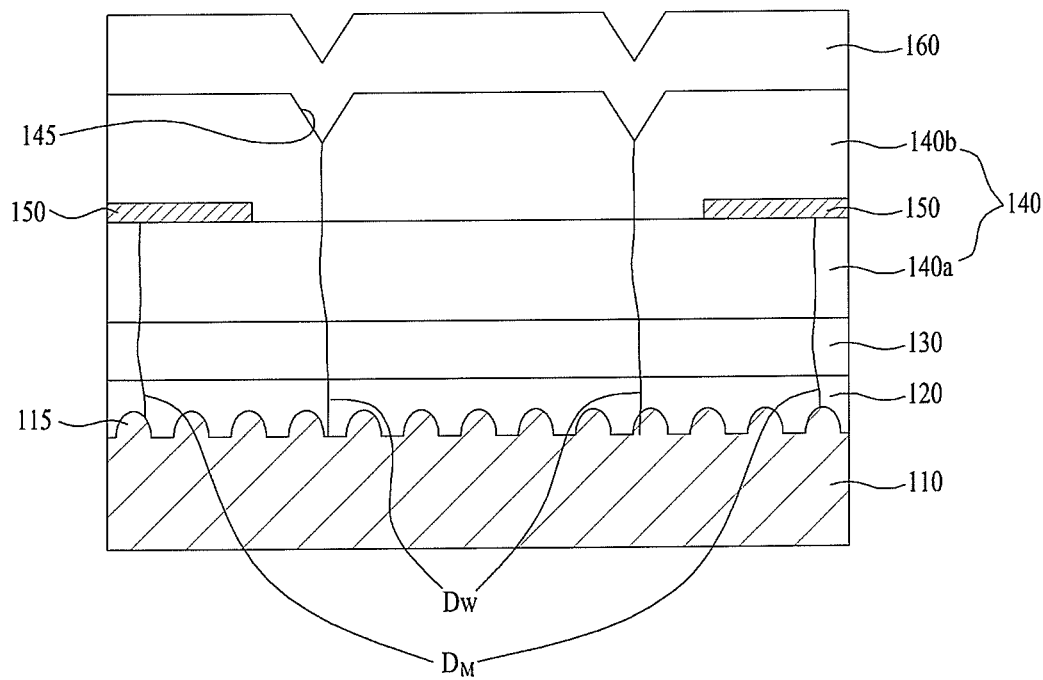

Thereafter, as shown in FIG. 7, the active layer 160 is grown over the first-conductivity-type semiconductor layer 140b, which is provided, at the upper surface thereof, with the recess portion 145.

In the active layer 160, electrons injected through the first-conductivity-type semiconductor layer 140 meet holes injected through the subsequently-formed second-conductivity-type semiconductor layer 180, thereby emitting light with energy determined by the intrinsic energy band of the material of the active layer 160 (light emitting layer).

The active layer 160 may have at least one of a single quantum well structure, a multi quantum well structure, a quantum wire structure, and a quantum dot structure. For example, the active layer 160 may have a multi quantum well structure through injection of tri-methyl gallium gas (TMGa), ammonia gas ($NH_3$), nitrogen gas ($N_2$), and tri-methyl indium gas (TMIn), although the embodiment is not limited thereto.

The active layer 160 may have a multilayer structure having well and barrier layers alternating at least one time. The well/barrier layers may have a layer pair structure made of at least one of InGaN/GaN, InGaN/InGaN, GaN/AlGaN, InAlGaN/GaN, GaAs(InGaAs)/AlGaAs, and GaP(InGaP)/AlGaP, although the embodiment is not limited thereto. The well layer may be made of a material having a narrower band gap than that of the barrier layer.

Since the active layer 160 is grown to conform to the structure of the upper surface of the first-conductivity-type semiconductor layer 140b, the active layer can have a recess portion which is formed at a portion of the upper surface of the active layer 160 corresponding to the recess portion 145 of the first-conductivity-type semiconductor layer 140b.

Figure 8:
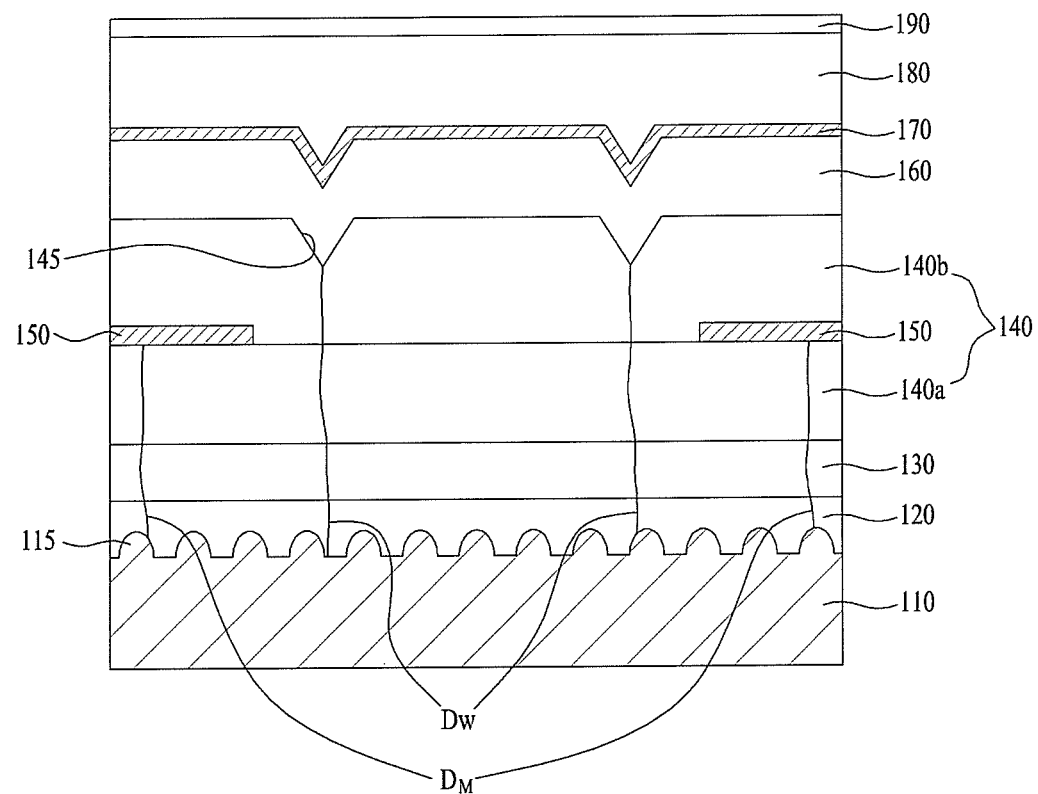

Referring to FIG. 8, the second-conductivity-type semiconductor layer 180 is subsequently formed over the active layer 160.

The second-conductivity-type semiconductor layer 180 may be made of a semiconductor compound, for example, a Group III-V compound semiconductor doped with a second-conductivity-type dopant. For example, the second-conductivity-type semiconductor layer 180 may include a semiconductor material having a formula of $In_xAl_yGa_{1-x-y}N$ ($0 \leq x \leq 1$, $0 \leq y \leq 1$, $0 \leq x+y \leq 1$). When the second-conductivity-type semiconductor layer 180 is a p-type semiconductor layer, the second-conductivity-type dopant is a p-type dopant. The p-type dopant may include Mg, Zn, Ca, Sr, Ba, or the like, although the embodiment is not limited thereto. When the second-conductivity-type semiconductor layer 180 is an n-type semiconductor layer, the second-conductivity-type dopant is an n-type dopant. The n-type dopant may include Si, Ge, Sn, Se, or Te, although the embodiment is not limited thereto.

The light emitting structure, which includes the above-described first-conductivity-type semiconductor layer 140, active layer 160, and second-conductivity-type semiconductor layer 180, may be formed using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like. Of course, the formation method is not limited to the above-described methods.

An electron blocking layer 170 may be interposed between the active layer 160 and the second-conductivity-type semiconductor layer 180.

The electron blocking layer 170 may include AlGaN. The electron blocking layer 170 functions as a potential barrier to prevent electrons injected from the first-conductivity-type semiconductor layer 140 from migrating to the second-conductivity-type semiconductor layer 180.

As the active layer 160 and electron blocking layer 170 are sequentially stacked, the recess portion formed at the region corresponding to the recess portion 145 has inclined surfaces having a reduced inclination. When the recess portion is completely filled with the material of the second-conductivity-type semiconductor layer 180, the upper surface of the second-conductivity-type semiconductor layer 180 may be flat without having a recess portion. The current spreading layer 190 may then be formed over the second-conductivity-type semiconductor layer 180.

The current spreading layer 190 may be formed on a portion or entirety of the upper surface of the second-conductivity-type semiconductor layer 180, although the embodiment is not limited thereto. For example, the current spreading layer 190 may be formed such that at least a portion thereof vertically overlaps the second electrode 184, which will be subsequently formed.

The current spreading layer 190 may be disposed such that at least a portion thereof contacts the second electrode 184.

Figure 9:
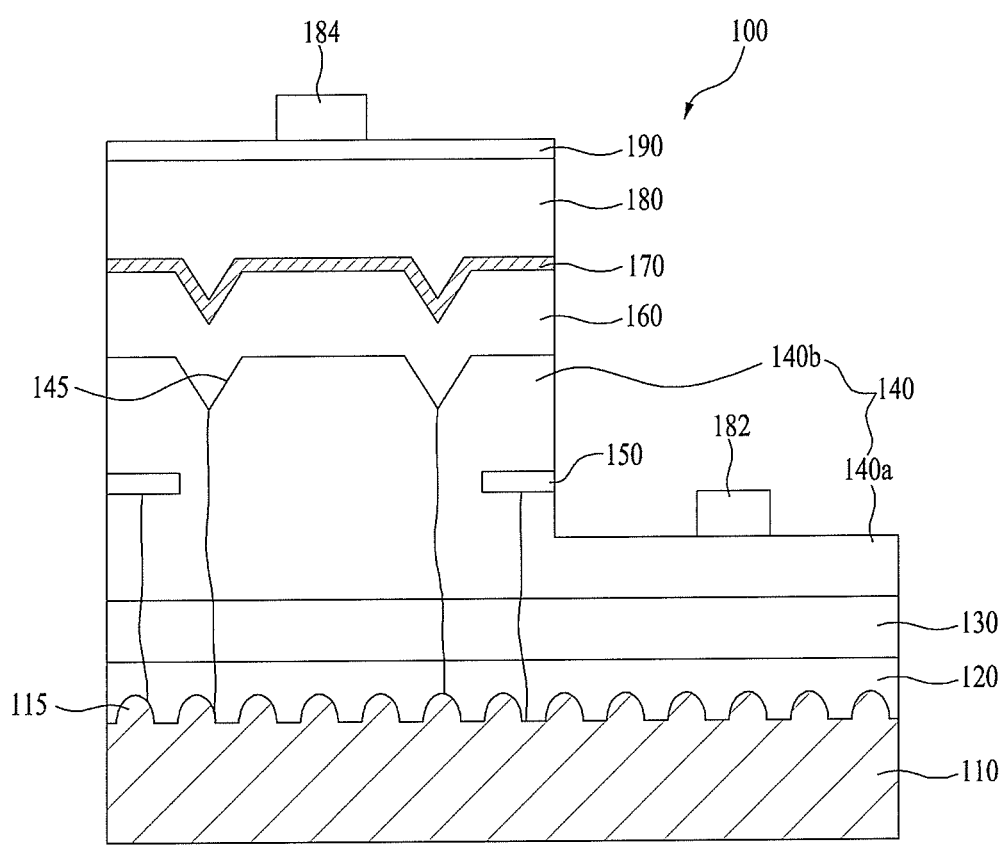

Referring to FIG. 9, the resulting structure is then mesa-etched from the second-conductivity-type semiconductor layer 180 to a portion of the first-conductivity-type semiconductor layer 140.

The first electrode 182 may be disposed on a portion of the first-conductivity-type semiconductor layer 140 exposed in accordance with the mesa-etching. The second electrode 184 may be disposed on the second-conductivity-type semiconductor layer 180.

The first and second electrodes 182 and 184 may be made of at least one of aluminum (Al), titanium (Ti), chromium (Cr), nickel (Ni), copper (Cu), or gold (Au), to have a single layer structure or a multilayer structure. As described above, the position of the threading dislocation reaching the top of the light emitting device is controlled using the mask layer 150. Also, the recess portion is formed at the position where the threading dislocation reaching the first-conductivity-type semiconductor layer is present. Accordingly, it may be possible to reduce the stress of the active layer and to improve the ESD characteristics of the light emitting device. Thus, the reliability of the light emitting device is enhanced.

Figure 10:
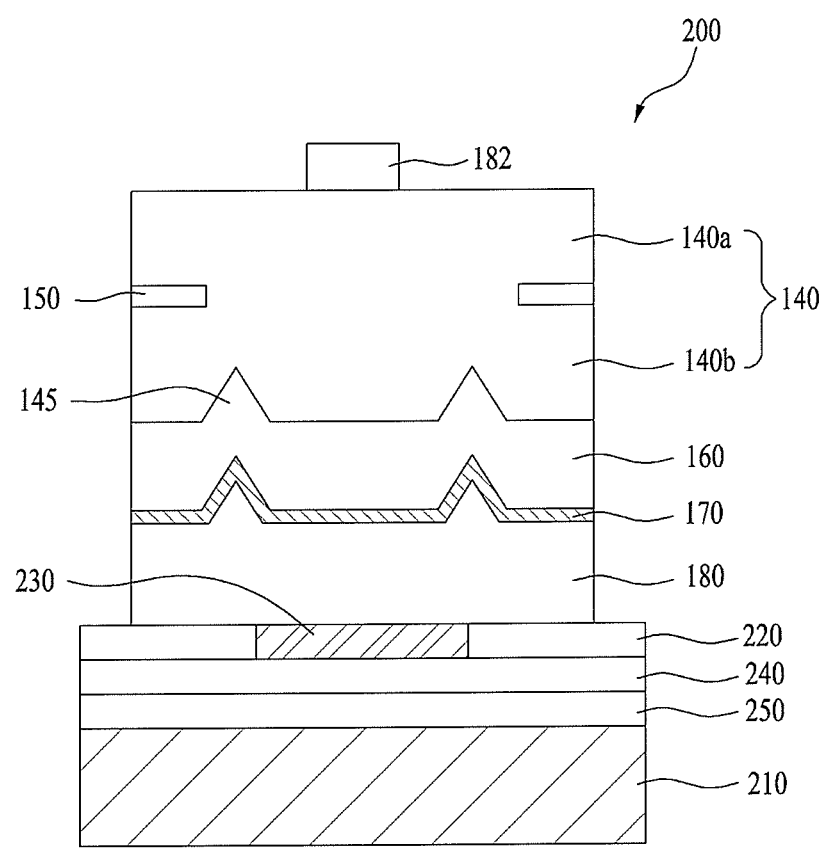
FIG. 10 is a sectional view illustrating a light emitting device according to another embodiment.

FIG. 10 is a sectional view illustrating a light emitting device according to another embodiment.

FIG. 1 illustrates an embodiment of a horizontal light emitting device. On the other hand, FIG. 10 illustrates an embodiment of a vertical light emitting device.

No description will be given of the configuration of FIG. 10 identical to the configuration described with reference to FIG. 1. That is, the following description will be given only in conjunction with the configurations of the light emitting device of FIG. 10 different than those of the light emitting device of FIG. 1.

The vertical light emitting device, which is designated by reference numeral "200", has a structure vertically inverted from the structure of the horizontal light emitting device 100. Accordingly, the recess portion 145 may have a structure having a width gradually reduced toward the top of the light emitting structure, namely, toward the first-conductivity-type semiconductor layer 140.

The vertical light emitting device 200 may be fabricated by separating the substrate 110, buffer layer 120, and undoped semiconductor layer 130, and then disposing an ohmic layer 220 and/or a reflection layer 240, and a support substrate 210 on the second-conductivity-type semiconductor layer 180.

The separation of the substrate 110, buffer layer 120, and undoped semiconductor layer 130 may be achieved through a laser lift-off (LLO) method using an excimer layer, or a dry or wet etching method.

When the second-conductivity-type semiconductor layer 180 is a p-type semiconductor layer, it has high contact resistance due to a low dopant concentration thereof. For this reason, the second-conductivity-type semiconductor layer 180 may exhibit poor metal ohmic characteristics. The ohmic layer 220 is adapted to improve the ohmic characteristics. The ohmic layer 220 is not a necessity.

For the ohmic layer 220, a light-transmitting conductive layer or a metal may be selectively used. For example, the ohmic layer 220 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—GaZnO (AGZO), In—GaZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, or Hf, although the embodiment is not limited thereto.

The reflection layer 240 may be disposed beneath the ohmic layer 220. The reflection layer 240 may be made of, for example, a selective combination of Ag, Ni, Al, Rh, Pd, Ir, Ru, Mg, Zn, Pt, Au, or Hf. Alternatively, the reflection layer 240 may be formed to have a multilayer structure, using the metal materials and a light-transmitting conductive material such as IZO, IZTO, IAZO, IGZO, IGTO, AZO, or ATO. The reflection layer 240 may have a lamination structure of IZO/Ni, AZO/Ag, IZO/Ag/Ni, AZO/Ag/Ni, or the like. When the reflection layer 240 is made of a material ohmic-contacting the light emitting structure (for example, the second-conductivity-type semiconductor layer 180), the ohmic layer 220 may be dispensed with, although the embodiment is not limited thereto.

The reflection layer 240 may effectively reflect light emitted from the active layer 160, thereby achieving a great enhancement in the light extraction efficiency of the light emitting device.

A current spreading layer 230 may be disposed beneath the second-conductivity-type semiconductor layer 180 of the light emitting structure. When the ohmic layer 220 is present, the current spreading layer 230 may be surrounded by the ohmic layer 220.

The current spreading layer 230 may be made of a metal having high electrical conductivity. For example, the current spreading layer 230 may selectively include at least one selected from the group consisting of Ti, Au, Ni, In, Co, W, or Fe, although the embodiment is not limited thereto.

The current spreading layer 230 may be formed such that at least a portion thereof vertically overlaps the first electrode 182.

The current spreading layer 230 uniformly spreads current flowing in the light emitting structure, thereby achieving an enhancement in the light emission efficiency of the light emitting device.

The support substrate 210 is disposed beneath the reflection layer 240. A bonding layer 250 may be interposed between the reflection layer 240 and the support substrate 210.

The bonding layer 250 may include a barrier metal, a bonding metal, or the like. For example, the bonding layer 250 may include at least one of Ti, Au, Sn, Ni, Cr, Ga, In, Bi, Cu, Ag, or Ta, although the embodiment is not limited thereto.

The support substrate 120 may be a conductive substrate in order to function as the second electrode while supporting the light emitting structure. The support substrate 210 may be made of a material having high electrical conductivity and high thermal conductivity. For example, the support substrate 210 may be formed as a base substrate having a certain thickness, using a material selected from the group consisting of molybdenum (Mo), silicon (Si), tungsten (W), copper (Cu), aluminum (Al), and alloys thereof. Also, the support substrate 210 may selectively include gold (Au), a Cu alloy, Ni, Cu—W, a carrier wafer (for example, GaN, Si, Ge, GaAs, ZnO, SiGe, SiC, SiGe, $Ga_2O_3$, or the like), a conductive sheet, or the like.

Figure 11:
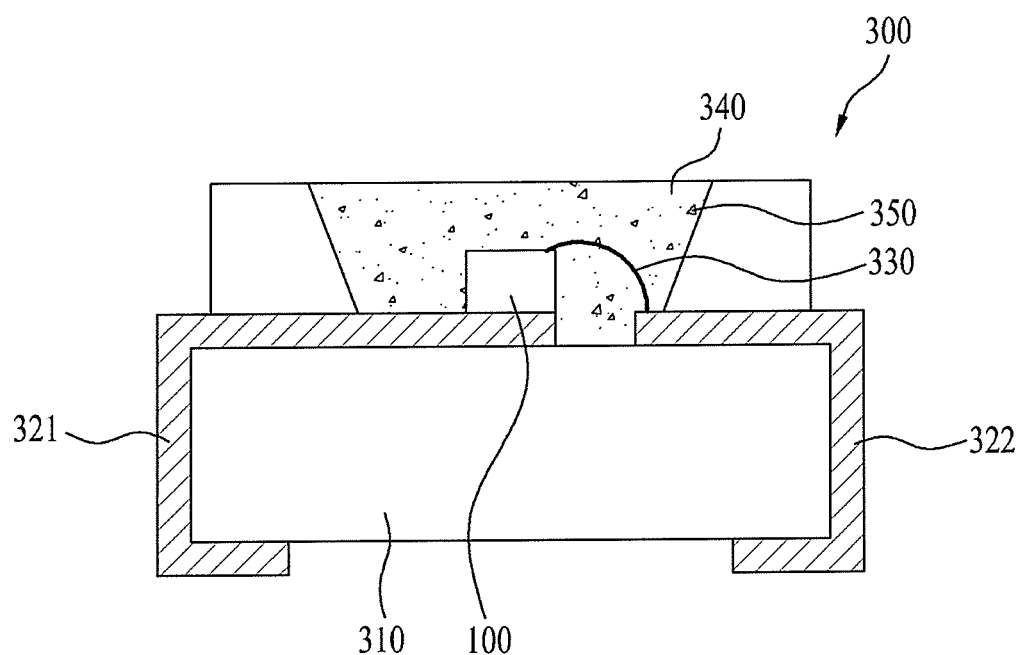
FIG. 11 is a view illustrating a light emitting device package according to an exemplary embodiment.

FIG. 11 is a view illustrating a light emitting device package according to an exemplary embodiment.

The light emitting device package according to the illustrated embodiment, which is designated by reference numeral "300", includes a body 310 formed with a cavity, first and second lead frames 321 and 322 mounted on the body 310, a light emitting device mounted on the body 310 while being electrically connected to the first and second lead frames 321 and 322, and a mold 340 formed in the cavity. The light emitting device may be the light emitting device 100 or 200 according to one of the above-described embodiment. In the illustrated case, the light emitting device is the light emitting device 100.

The cavity may function as a reflector for reflecting light generated from the light emitting device included in the light emitting device package 300. The cavity is not necessarily required, and the body 310 may have a flat upper surface.

The body 310 may be made of a silicon material, a synthetic resin material, or a metal material. When the body 210 is made of a conductive material such as a metal material, an insulating layer is coated over the surface of the body 310, although not shown, in order to avoid electrical short circuit between the first and second lead frames 321 and 322.

The first and second lead frames 321 and 322 are electrically isolated from each other, and supply current to the light emitting device 100. The first and second lead frames 321 and 322 may also reflect light generated from the light emitting device 100 so as to achieve an enhancement in luminous efficiency. In addition, the first and second lead frames 321 and 322 may function to outwardly dissipate heat generated from the light emitting device 100.

The light emitting device 100 may be mounted on the body 310 or on the first lead frame 321 or second lead frame 322. In the illustrated embodiment, the light emitting device 100 is directly electrically connected to the first lead frame 321 while being connected to the second lead frame 322 via a wire 330. The light emitting device 100 may be connected to the lead frames 321 and 322, using a flip-chip method or a die-bonding method, in place of the wire-bonding method.

The mold 340 encapsulates the light emitting device 100, to protect the light emitting device 100. The mold 340 includes phosphors 350, to change the wavelength of light emitted from the light emitting device 100.

Light of a first wavelength range emitted from the light emitting device 100 is excited by the phosphors 350, so that it is changed into light of a second wavelength range. As the light of the second wavelength range passes through a lens (not shown), the optical path thereof may be changed.

A plurality of light emitting device packages, each of which has the above-described structure according to the illustrated embodiment, is prepared, and is then arrayed on a substrate. Optical members, namely, light guide plates, prism sheets, diffusion sheets, etc., may be arranged on optical paths of the light emitting device packages. Such light emitting device packages, substrate, optical members may function as a light unit. In accordance with another embodiment, a display apparatus, an indication apparatus or a lighting system may be implemented using the semiconductor light emitting devices or light emitting device packages described in conjunction with the above-described embodiments. The lighting system may include, for example, a lamp or a street lamp.

Hereinafter, a lighting apparatus, a head lamp, and a backlight unit as embodiments of the lighting system including the above-described light emitting device packages will be described.

Figure 12:
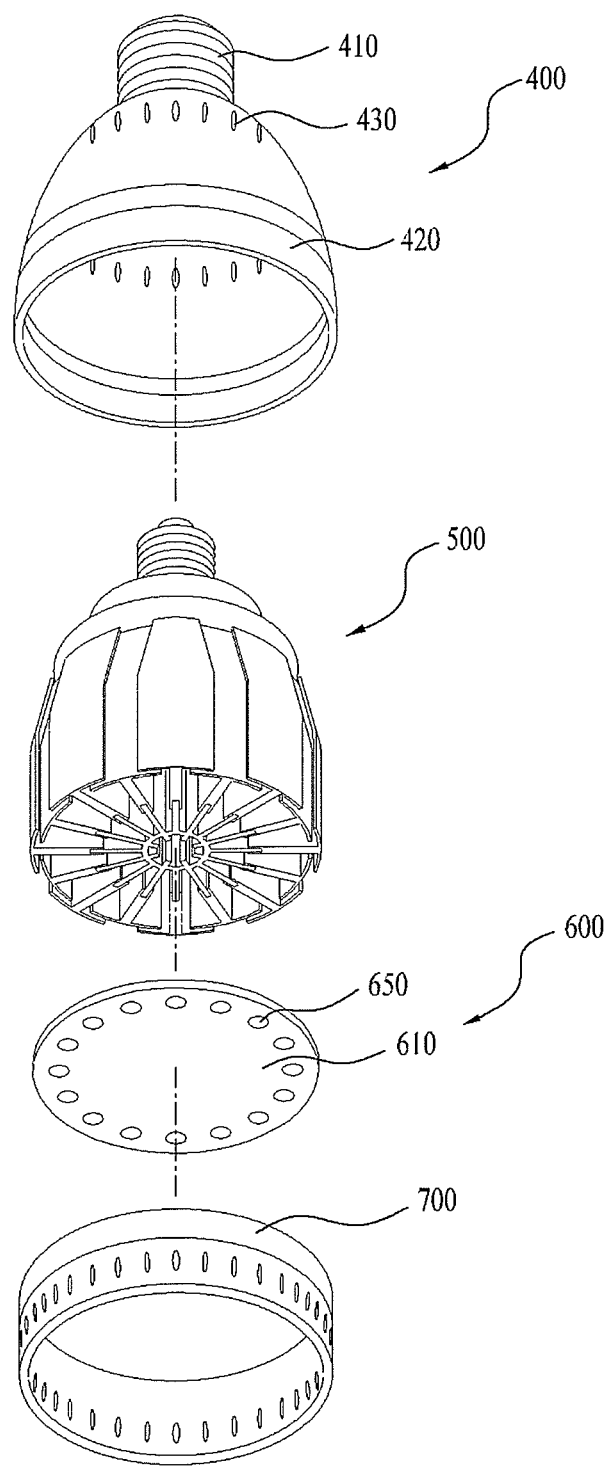
FIG. 12 is an exploded perspective view illustrating a lighting apparatus according to an exemplary embodiment, which include light emitting device packages according to the above-described embodiment.

FIG. 12 is an exploded perspective view illustrating a lighting apparatus according to an exemplary embodiment, which include the light emitting device packages according to the above-described embodiment.

Referring to FIG. 12, the lighting apparatus according to the illustrated embodiment includes a light source 600 for projecting light, a housing 400 in which the light source 600 is mounted, a heat dissipation unit 500 for dissipating heat generated from the light source 600, and a holder 700 for coupling the light source 600 and heat dissipation unit 500 to the housing 400.

The housing 400 includes a socket connection part 410 connected to an electric socket (not shown), and a body part 420 connected to the socket connection part 410. The light source 600 is received in the body part 420. A plurality of air holes 430 may be formed through the body part 420.

Although a plurality of air holes 430 are formed through the body part 420 of the housing 400 in the illustrated case, a single air hole 430 may be formed through the body part 420. Although the plural air holes 430 are circumferentially arranged, various arrangements thereof may be possible.

The light source 600 includes a circuit board 610 and a plurality of light emitting device packages 650 mounted on the circuit board 610. Here, the circuit board 610 may be shaped to be fitted in an opening formed at the housing 400. Also, the circuit board 610 may be made of a material having high thermal conductivity so as to transfer heat to the heat dissipation unit 500, as will be described later.

The holder 700 is disposed under the light source 600. The holder 700 includes a frame and air holes. Although not shown, an optical member may be disposed under the light source 600 so as to diffuse, scatter or converge light projected from the light emitting device packages 650 of the light source 600.

Figure 13:
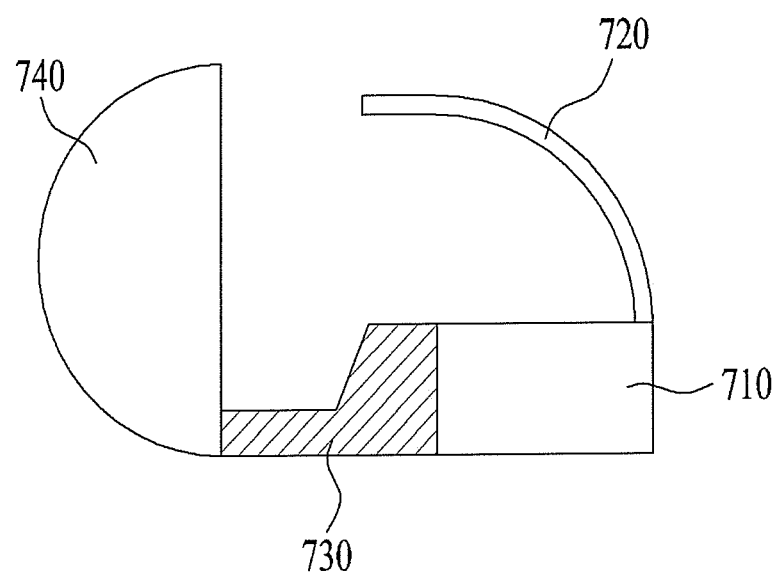
FIG. 13 is a view illustrating a head lamp according to an exemplary embodiment, in which the light emitting device according to one of the above-described embodiments is disposed.

FIG. 13 is a view illustrating a head lamp according to an exemplary embodiment, in which the light emitting device according to one of the above-described embodiments is disposed.

Referring to FIG. 13, light emitted from a light emitting module 710, in which the light emitting device according to one of the above-described embodiments is disposed, passes through a lens 740 after being reflected by a reflector 720 and a shade 730, so as to be directed forwardly of a vehicle body.

As described above, the light emitting device according to the above-described embodiment, which is used in the light emitting module 710, has ESD characteristics improved by the recess portion, and thus achieves an enhancement in reliability.

The light emitting device package, which is included in the light emitting module 710, may include a plurality of light emitting devices, although the embodiment is not limited thereto.

Figure 14:
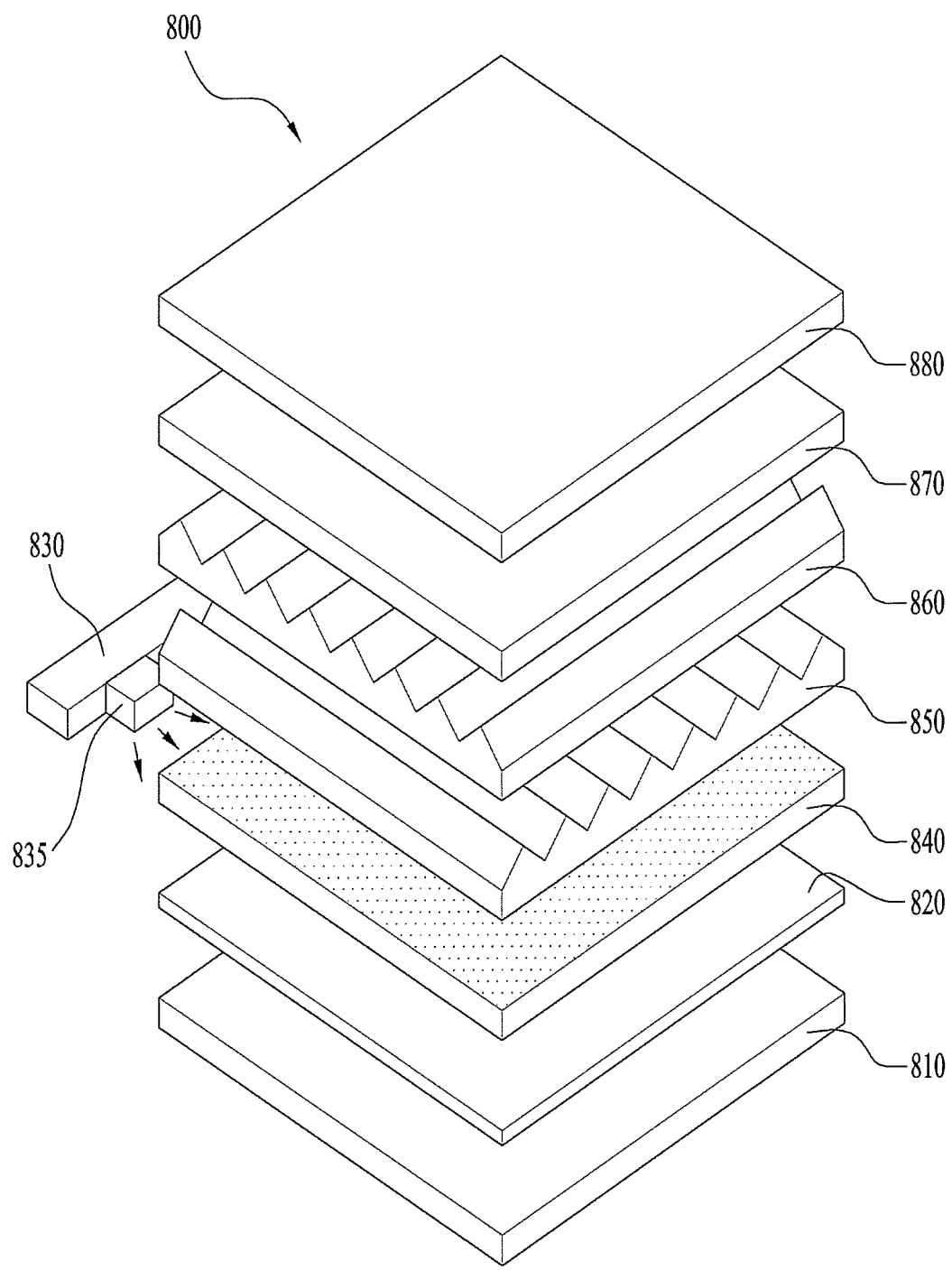
FIG. 14 is a view illustrating a display apparatus according to an exemplary embodiment in which light emitting device packages according to the above-described embodiment are arranged.

FIG. 14 is a view illustrating a display apparatus according to an exemplary embodiment in which light emitting device packages according to the above-described embodiment are arranged.

As shown in FIG. 14, the display apparatus according to the illustrated embodiment, which is designated by reference numeral "800", includes a light source module, a reflection plate 820 disposed on a bottom cover 810, a light guide plate 840 disposed in front of the reflection plate 820 to guide light emitted from the light source module to a front side of the display apparatus 800, first and second prism sheets 850 and 860 disposed in front of the light guide plate 840, a panel 870 disposed in front of the second prism sheet 860, and a color filter 880 disposed in front of the panel 870.

The light source module includes a circuit board 830 and light emitting device packages 835 mounted on the circuit board 830. Here, a printed circuit board (PCB) may be used as the circuit board 830. The light emitting device packages 835 may have the configuration described above in conjunction with FIG. 11.

The bottom cover 810 serves to receive the constituent elements of the display apparatus 800. The reflection plate 820 may be provided as a separate element, as shown in FIG. 14, or may be provided as a material having high reflectivity is coated over a rear surface of the light guide plate 840 or a front surface of the bottom cover 810.

Here, the reflection plate 820 may be made of a material having high reflectivity and capable of being formed into an ultra thin structure. Polyethylene terephthalate (PET) may be used for the reflection plate 820.

The light guide plate 840 serves to scatter light emitted from the light source module so as to uniformly distribute the light throughout all regions of a liquid crystal display apparatus. Therefore, the light guide plate 840 may be made of a material having high refractivity and transmissivity. The material of the light guide plate 840 may include polymethylmethacrylate (PMMA), polycarbonate (PC) or polyethylene (PE). The light guide plate may be dispensed with. In this case, an air guide system, which transfers light in a space over the reflective sheet 820, may be implemented.

The first prism sheet 850 may be formed by coating a polymer exhibiting light transmittance and elasticity over one surface of a base film. The first prism sheet 850 may have a prism layer having a plurality of three-dimensional structures in the form of a repeated pattern. Here, the pattern may be a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light module and the reflective sheet 820 toward the entire surface of the panel 870.

In the illustrated embodiment, an optical sheet may be constituted by the first prism sheet 850 and second prism sheet 860. However, the optical sheet may include other combinations, for example, a microlens array, a combination of a diffusion sheet and a microlens array, and a combination of a prism sheet and a microlens array.

A liquid crystal display panel may be used as the panel 870. Further, instead of the liquid crystal display panel 870, other kinds of display devices requiring light sources may be provided.

The display panel 870 is configured such that a liquid crystal layer is located between glass bodies (transparent substrates), and polarizing plates are mounted on both glass bodies so as to utilize polarizing properties of light. Here, the liquid crystal layer has properties between a liquid and a solid. That is, in the liquid crystal layer, liquid crystals which are organic molecules having fluidity like the liquid are regularly oriented, and the liquid crystal layer displays an image using change of such molecular orientation due to an external electric field.

The liquid crystal display panel used in the display apparatus is of an active matrix type, and uses transistors as switches to adjust voltage applied to each pixel.

The color filter 880 is provided on the front surface of the panel 870, and transmits only an R, G or B light component of light projected from the panel 870 per pixel, thereby displaying an image.

As is apparent from the above description, the embodiments improve the ESD characteristics of the light emitting device, and thus enhance the reliability of the light emitting device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting diode comprising:
   a light emitting structure including a first-conductivity-type semiconductor layer, a second-conductivity-type semiconductor layer, and an active layer disposed between the first-conductivity-type semiconductor layer and the second-conductivity-type semiconductor layer;
   an electrode on the second conductivity-type semiconductor layer of the light emitting structure; and
   a mask layer disposed in the first-conductivity-type semiconductor layer;
   wherein the first-conductivity-type semiconductor layer includes at least one recess portion,
   wherein the light emitting structure is mesa-etched from the second-conductivity-type semiconductor layer to a part of the first-conductivity-type semiconductor layer, and
   wherein the mask layer is disposed in an upper part of the first-conductivity-type semiconductor layer as compared to a surface of the first-conductivity-type semiconductor layer exposed by the mesa-etching,
   wherein the mask layer includes a masking region and a window region that is distinguished from the masking region, and the recess portion is to correspond to the window region, and the electrode is to correspond to the window region.

2. The light emitting diode according to claim 1, wherein the recess portion is formed in the first-conductivity-type semiconductor layer.

3. The light emitting diode according to claim 2, wherein the recess portion is disposed between the window region and the active layer.

4. The light emitting diode according to claim 1, wherein the mask layer comprises at least one of SiO2 or SiN.

5. The light emitting diode according to claim 1, wherein the mask layer is patterned such that a horizontal section shape of the patterned mask layer has a predetermined shape.

6. The light emitting diode according to claim 5, wherein the horizontal section shape of the mask layer comprises a lattice shape, a stripe shape, a circular shape, an oval shape, or a polygonal shape.

7. The light emitting diode according to claim 1, wherein the light emitting structure is disposed over a substrate, and the substrate comprises a light extraction structure formed at a surface of the substrate, to which the light emitting structure is adjacent.

8. The light emitting diode according to claim 1, further comprising an electron blocking layer disposed between the active layer and the second-conductivity-type semiconductor layer.

9. The light emitting diode according to claim 1, wherein the mask layer has a thickness of 0.01 to 1.5 µm.

10. The light emitting diode according to claim 1, wherein the window region and the masking region have a width ratio of 1:0.1 to 10.

11. The light emitting diode according to claim 1, wherein the recess portion is formed at a portion of an upper surface of the first-conductivity-type semiconductor layer where a threading dislocation from a lower portion of the light emitting diode reaches, wherein the masking region of the mask layer blocks at least a part of the threading dislocations advancing toward a top of the light emitting structure.

12. The light emitting diode according to claim 1, wherein the recess portion comprises a V-pit shape, an inverted polygonal corn shape, or an inverted pyramid shape.

13. The light emitting diode according to claim 1, wherein the active layer is formed with a recess portion corresponding to the recess portion of the first-conductivity-type semiconductor layer.

14. A light emitting device package comprising:
a package body;
first and second lead frames disposed on the package body; and
a light emitting diode disposed on the package body, and the light emitting diode being electrically connected to the first and second lead frames,
wherein the light emitting diode includes a substrate, a light emitting structure disposed on the substrate, the light emitting structure including a first-conductivity-type semiconductor layer, a second-conductivity-type semiconductor layer, and an active layer disposed between the first-conductivity-type semiconductor layer and the second-conductivity-type semiconductor layer, an electrode on the light emitting structure, and a mask layer disposed in the first-conductivity-type semiconductor layer, and
wherein the first-conductivity-type semiconductor layer is formed with at least one recess portion,
wherein the active layer is a light emitting region and the mask layer is disposed in the first-conductivity-type semiconductor layer corresponding to the light emitting region,
wherein the mask layer is disposed in an upper part of the first-conductivity-type semiconductor layer as compared to a surface of the first-conductivity-type semiconductor layer exposed by mesa-etching, and wherein the mask layer includes a masking region and a window region distinguished from the masking region, and the recess portion is to correspond to the window region, and the electrode is to correspond to the window region.

15. The light emitting device package according to claim 14, wherein the recess portion is formed at a portion of an upper surface of the first-conductivity-type semiconductor layer where a threading dislocation from a lower portion of the light emitting diode reaches, wherein the masking region of the mask layer blocks at least a part of the threading dislocations advancing toward a top of the light emitting structure.

* * * * *